(12) United States Patent
Jeter et al.

(10) Patent No.: US 9,286,961 B1
(45) Date of Patent: Mar. 15, 2016

(54) MEMORY CONTROLLER HALF-CLOCK DELAY ADJUSTMENT

(71) Applicant: Apple Inc., Cupertino, CA (US)

(72) Inventors: Robert E. Jeter, Santa Clara, CA (US);
Rakesh L. Notani, Sunnyvale, CA (US);
Kiran B. Kattel, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/672,412

(22) Filed: Mar. 30, 2015

(51) Int. Cl.
*G11C 7/22* (2006.01)
*G11C 8/18* (2006.01)
*H03L 7/08* (2006.01)

(52) U.S. Cl.
CPC ... *G11C 8/18* (2013.01); *H03L 7/08* (2013.01)

(58) Field of Classification Search
CPC .......... G11C 7/04; G11C 7/10; G11C 7/1066; G11C 7/1072; G11C 7/1093; G11C 7/222; G11C 11/4076; G11C 2207/2254
See application file for complete search history.

(56) References Cited

U.S. PATENT DOCUMENTS

| | | | |
|---|---|---|---|
| 6,748,549 B1 * | 6/2004 | Chao | G01R 31/31937 365/194 |
| 7,701,802 B2 | 4/2010 | Vergnes et al. | |
| 8,228,747 B2 * | 7/2012 | Onishi | G11C 7/1066 365/191 |
| 8,269,538 B2 | 9/2012 | Hassan | |
| 8,565,033 B1 | 10/2013 | Manohararajah et al. | |
| 2013/0297961 A1 | 11/2013 | Zhu et al. | |
| 2014/0181429 A1 | 6/2014 | Malladi et al. | |
| 2014/0247637 A1 | 9/2014 | Best et al. | |

* cited by examiner

*Primary Examiner* — Andrew Q Tran
(74) *Attorney, Agent, or Firm* — Meyertons, Hood, Kivlin, Kowert & Goetzel, P.C.; Erik A. Heter

(57) ABSTRACT

A method and apparatus for reducing a number of delay elements used in providing a delayed data strobe signal is disclosed. The method includes determining a number of delay elements of a master delay locked loop (DLL) needed to provide a calibrated delay of a clock signal (i.e. the data strobe). The method also include determining an integer number of half clock periods within the calibrated delay, and determining a second number of delay elements within the calibrated delay. If the integer number of half clock periods within the calibrated delay is zero, a slave DLL may be programmed with the first number of delay elements. However, if the number of half clock periods is non-zero, then a third number of delay elements is calculated by subtracting the second number of delay elements from the first number. Thereafter, the slave DLL is programmed with the third number of delay elements.

20 Claims, 7 Drawing Sheets

MEMORY CONTROLLER HALF-CLOCK DELAY ADJUSTMENT

BACKGROUND

1. Technical Field

This disclosure is directed to computer systems, and more particularly, to memory subsystems in which data transfers are synchronized to a clock signal.

2. Description of the Related Art

In many memory systems, such as various double data rate (DDR) systems, a clock signal known as a data strobe is transmitted along with data. Data received at, e.g., the memory, may be synchronized to the data strobe.

As clock speeds increase, inherent delays between the data strobe and the data may become problematic. Such delays may be exacerbated by voltage and temperature variations. In some cases, memory manufacturers may match internal delays between the data strobe and data signals as a method of compensation. In other cases, calibrations may be performed to align the data strobe to the data signals.

SUMMARY

A method and apparatus for reducing a number of delay elements used in providing a delayed data strobe signal is disclosed. The data strobe may be provided from a memory controller to a memory, and used to synchronize data transmitted from the memory controller to the memory. The method includes determining a number of delay elements of a master delay locked loop (DLL) needed to provide a calibrated delay of a clock signal (i.e. the data strobe). The method also includes determining an integer number of half clock periods within the calibrated delay, and determining a second number of delay elements within the calibrated delay. If the integer number of half clock periods within the calibrated delay is zero, a slave DLL may be programmed with the first number of delay elements. However, if the number of half clock periods is non-zero, then a third number of delay elements is calculated by subtracting the second number of delay elements from the first number. Thereafter, the slave DLL is programmed with the third number of delay elements.

In one embodiment, the method includes performing a frequency change of the clock signal. Prior to performing the frequency change, a calibration of the delay is performed. The number of half clock periods at the new target frequency is predicted prior to the change thereto, and prior to the calibration. The frequency change is then made subsequent to determining the number of half clock periods within the delay. After the frequency change is performed, a determination may be made to determine the number of delay elements with which the slave DLL is programmed to achieve the calibrated delay. If the number of half clock periods is non-zero, the number of delay elements with which the slave DLL is programmed excludes the number of delay elements needed to provide the half clock periods of delay.

Various embodiments of an apparatus capable of performing the methods discussed herein are also possible and contemplated.

BRIEF DESCRIPTION OF THE DRAWINGS

The following detailed description makes reference to the accompanying drawings, which are now briefly described.

Figure 1:
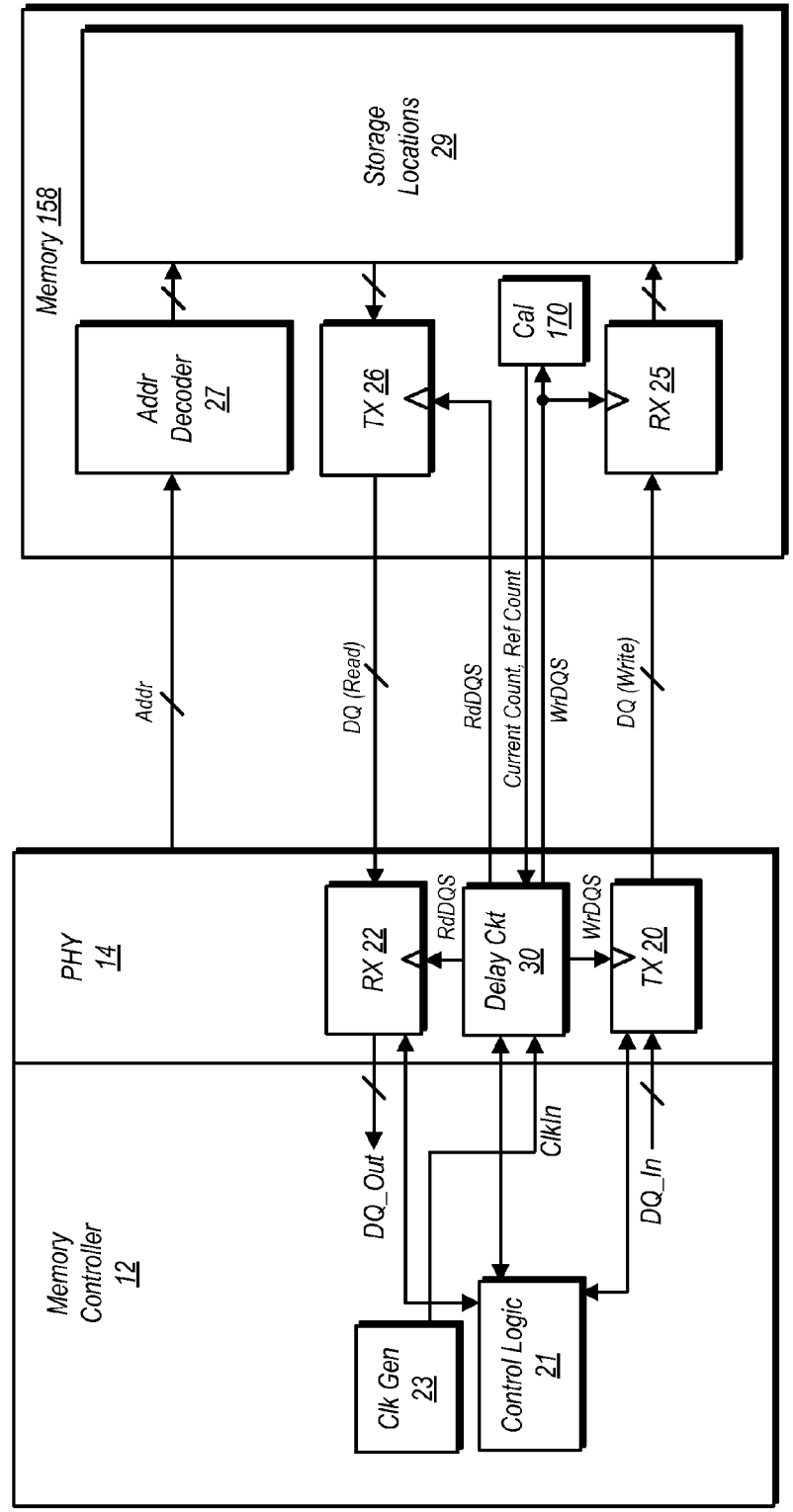
FIG. 1 is a block diagram of one embodiment of a memory subsystem including a memory controller and a memory.

While the disclosed subject matter is susceptible to various modifications and alternative forms, specific embodiments thereof are shown by way of example in the drawings and will herein be described in detail. It should be understood, however, that the drawings and detailed description thereto are not intended to limit the subject matter to the particular form disclosed, but on the contrary, the intention is to cover all modifications, equivalents and alternatives falling within the spirit and scope of the disclosed subject matter as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) (or pre-AIA paragraph six) interpretation for that unit/circuit/component.

DETAILED DESCRIPTION OF EMBODIMENTS

Turning now to FIG. 1, a block diagram of a system having a memory controller and a memory is shown. In the embodiment shown, system 5 includes a memory controller 12 and a memory 158. The memory controller 12 includes a physical layer 14 which is used for interfacing with memory 158. The physical layer 14 includes a receiver 22 configured to receive data read from memory 158, and a transmitter 20 configured to transmit data to memory 158. Memory 158 includes an address decoder 27, a number of storage locations 29, a receiver 25 configured to receive data to be written and a transmitter 26 configured to transmit data that has been read.

Although not explicitly shown, memory 158 may include additional logic for receiving read and write enable signals, with such logic being configured to enable selected storage locations for read and write operations, respectively. Additionally, memory controller 12 in the embodiment shown includes control logic 21, which may perform various functions, including conducting various embodiments of a calibration method discussed below.

Physical layer 14 includes a delay circuit 30 that is coupled to receive an input clock signal ('Clk'). The delay circuit 30 may in turn transmit two different clock signals to memory 158 in order to synchronize the transmission of data between memory 158 and memory controller 12. A first of these clock signals is the write data strobe, WrDQS, which is used to synchronize transfers of data to memory 158 during writes thereto. The second of these clock signals is the read data strobe, RdDQS, which is used to synchronize transfers of data from memory during reads therefrom.

In the embodiment shown, delay circuit 30 may include two separate paths to apply delays to the input clock signal to generate the read data strobe ('RdDQS') and the write data strobe ('WrDQS'). For example, one embodiment of delay circuit 30 may include a multiple delay locked loops (DLLs), including one configured to output the read data strobe and one to output the write data strobe. In some embodiments, DLLs that output data strobe signals may be slave DLLs that receive an incoming clock signal from a corresponding master DLL. The delays of the respective DLLs may be set by various mechanisms, such as by codes programmed into the various DLLs. These codes may be determined during one or more calibration procedures that are performed to align the data strobe signals.

Memory 158 in the embodiment shown includes an address decoder 27 coupled to receive an address from physical layer 14 of memory controller 12. Address decoder 27 may decode the received address to enable particular ones of the storage locations 29 that are to be enabled for a current memory operation. Addresses may be provided from physical layer 14 of memory controller 12 for both read operation and write operations.

The data strobe signals provided by delay circuit 30 may be subject to inherent delays, particularly on the side of memory 158. Since the clock edges of the data strobe signals are used to validate data received from memory controller 12 when received by receiver 25 at memory 158, as well as to validate data transmitted from transmitter 26 of memory 158, it is important that setup and hold time requirements for both are observed. Moreover, the data strobe signals used herein are used to synchronize the sampling of multiple bits. Furthermore, the signal paths for conveying bits between memory controller 12 and memory 158 may each be subject to their own unique delays, and thus some inter-lane skew may be present among the data bits. It is desirable that each data signal be sampled at or near the center of a window that may be depicted by an eye diagram. Various, calibration procedures may be performed at certain times during operation of memory controller 12 in order to optimize the point in time at which the data strobe signals sample data. The calibration procedures may be conducted under the control of control logic 21, and involved performing a number of reads of from memory along with adjustments of an amount of delay applied to the data strobe signal being calibrated. Various embodiments of calibration procedures are now discussed in further detail.

In one embodiment, the primary calibration of the delay of the data strobe signal may include performing a number writes of data to and reads of data from memory controller 12 to memory 158. The data obtained from each read may be compared to expected data, with pass/fail determinations made based on the comparisons. A window of passing delay values may be determined. For example, an upper limit of the window may be an upper delay value at which all bits passed. A lower limit of the window may be a lower delay value at which all bits passed. Alternatively, upper and lower limits of the delay window may be determined based on upper and lower limits at which at least one bit passed. Irrespective of the exact methodology used to perform the data strobe delay calibration, a delay value is determined and is used to provide the basis for subsequent calibrations that occur between each instance of the data strobe delay calibrations.

Between the calibrations of the delay, a DLL self-calibration may be performed on the memory controller side, while another calibration may be performed on the memory side. The different calibration procedures may be performed at different intervals. For example, the delay calibration procedure may be performed at first intervals (e.g., 100 ms). The calibration on the memory side may be performed at second intervals (e.g., 1 ms) to track voltage and temperature changes there. The calibrations that are performed entirely on the memory side may be performed by calibration circuit 170, which may convey information back to delay circuit 30. Calibration circuit 170 may perform calibrations using various types of circuits to track drift due to voltage and temperature. In one embodiment, calibration circuit 170 may include an oscillator and a counter to determine a count value within a given number of cycles of the write data strobe. The count values may be conveyed back to the memory controller side, and may be used as a basis to determine the drift in delay from a reference value. In one embodiment, the calibration performed on the memory side may be performed at third intervals more often than the self-calibration of the DLL (e.g., every 100 µs). Both the self-calibration of the DLL on the memory controller side and the calibration performed on the memory side may be performed more often than the calibration of the delay discussed above. As is discussed below, the DLL self-calibration and the calibration performed on the memory side by calibration circuit 170 may be used to generate scaling factors applied to the various DLL codes in order to maintain the calibrated delay through voltage and temperature changes.

It is noted that while the calibration procedures are discussed herein within the context of a memory subsystem and transfer of data between the memory and a memory controller, the disclosure is not limited as such. In contrast, various embodiments of the calibration methods discussed herein may be utilized with a number of systems in which data transfers of a number of bits are synchronized to a particular clock signal.

Memory controller 12 in the embodiment shown also includes clock generation circuit 23, which is configured to generate the clock signal, ClkIn. This clock signal may be used as a basis for generating the write data strobe and the read data strobe. The clock signal may be generated using any suitable type of clock generation circuitry, such as a phase locked loop, oscillator, or other circuitry configured for generation of periodic signals. In some embodiments, clock generation circuit 23 may be configured to adjust the phase of the clock signal by various portions of the clock signal period, e.g., by half cycles of the clock period.

Figure 2:
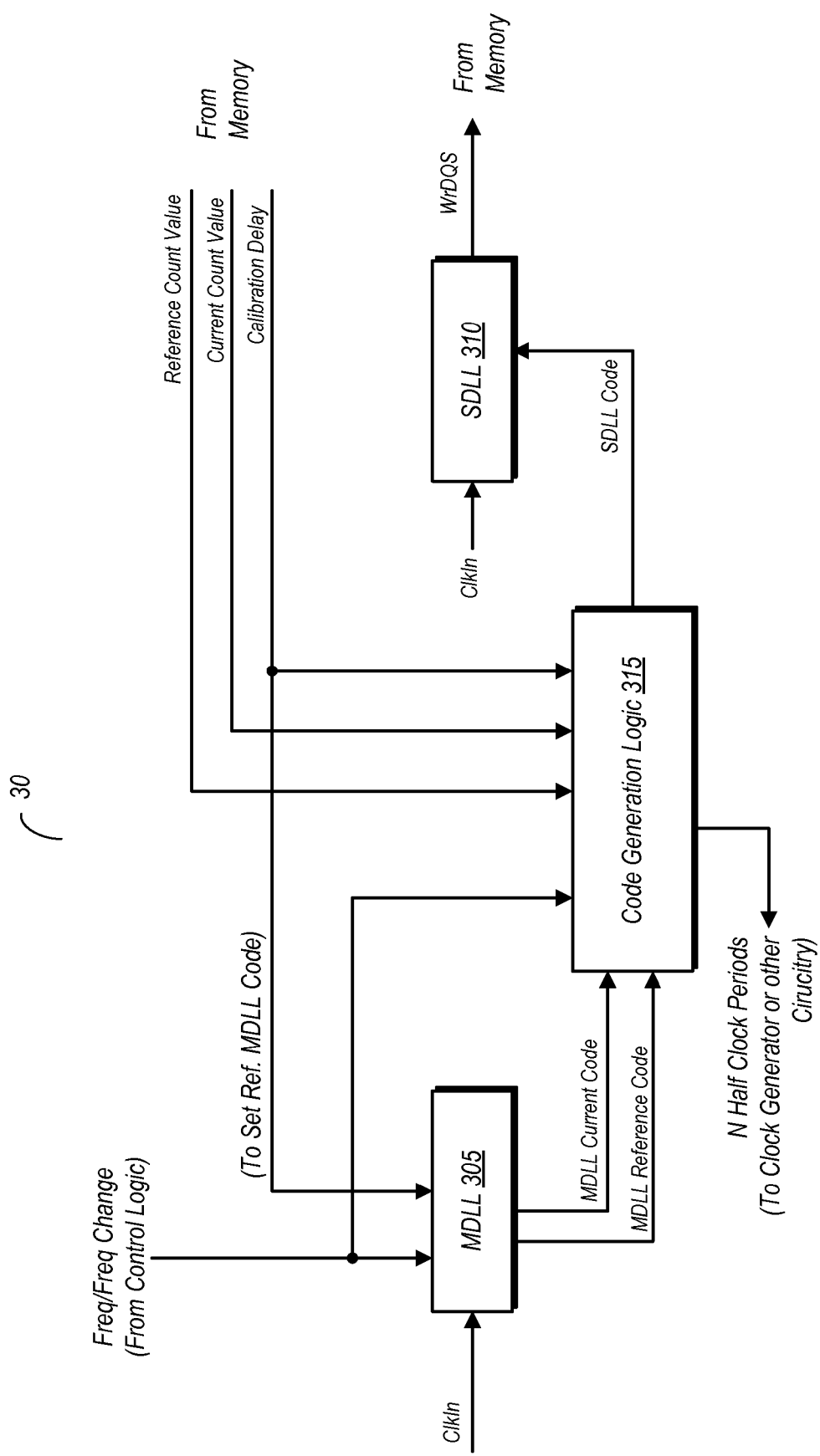
FIG. 2 is a block diagram of one embodiment of a delay circuit in a memory subsystem.

Turning now to FIG. 2, a block diagram illustrating part of one embodiment of a delay circuit is shown. In particular, the portions of delay circuit 30 illustrated here are directed to setting and maintaining a calibrated delay of the write data strobe signal, WrDQS. The illustrated portion of delay circuit 30 includes a master DLL (MDLL) 305, a slave DLL (SDLL) 310, and code generation logic 315. MDLL 305 in the embodiment shown is coupled to receive a clock signal, ClkIn, which provides the basis for the write data strobe signal. During operation, MDLL 305 acts to maintain a delay of the data strobe through adjustments to the MDLL code. Code generation logic 315, using various information, may generate a code to program SDLL 310 in order to provide and maintain the calibrated delay of the write data strobe signal. During the calibrations that occur between delay calibrations, scaling factors may be applied, resulting in adjustments to the code used to program SDLL 310.

In programming the SDLL 310, it is desirable to minimize the number of delay elements used to apply the delay. Generally speaking, a greater number of delay elements used results in greater power consumption and more jitter within the output clock signal (the write data strobe in this case). Conversely, reducing the number of delay elements used reduces both power consumption and the jitter. Accordingly, code generation logic 315 is configured to reduce the number of delay elements that are used by SDLL in providing the delay. In particular, code generation logic 315 is configured to determine an integer number of half clock periods within a calibrated delay. Consider a situation in which a calibrated delay is 500 ps, but one half clock period is 400 ps. Accordingly, there is one half clock period within the calibrated delay. SDLL 310 may be programmed to provide 100 ps of the delay. If one or more half clock periods are within the calibrated delay, a determination is made as to the number of delay elements within the integer number of half clock periods. This number of delay elements may be subtracted from a total number of delay elements to produce a remainder value. SDLL 310 may then be programmed with the remainder value, which may be significantly less than the total number of delay elements that would be used to provide the calibrated delay. Compensation to provide the half clock periods may be performed elsewhere, e.g., by phase shifting the clock signal output by clock generation circuit 23.

Consider the following example. Assume that the calibrated delay is equivalent to the delay provided by 65 delay elements, while a single half clock period equivalent to the delay provided by 40 delay elements falls within the calibrated delay. Accordingly, by subtracting the number of delay elements of the single half clock period from the total number of delay elements equivalent to the calibrated delay, we are left with 25 delay elements. SDLL 310 can then be programmed with 25 delay elements, thereby achieving the equivalent overall delay with fewer delay elements. In the various embodiments discussed herein, delay circuit 30 may include circuits configured to determine DLL programming codes to program SDLL 310 with a reduced number of delay elements as described herein. Furthermore, delay circuit 30 may also include circuitry that applies scaling factors to the calibrated delay to ensure that the delay provided by SDLL tracks voltage and temperature changes during operation. Circuitry may also be included to enable calibration and determination of a number of integer half clock periods within a calibrated delay value in conjunction with a change of the frequency of the write data strobe signal.

Code generation logic 315 in the embodiment shown is configured to determine the SDLL code based on a number of different pieces of information. Initially, the SDLL code may be set based on a calibrated delay and a number of half clock periods, if any, within the delay as described above. From MDLL 305, code generation logic 315 may receive a current MDLL code and a reference MDLL code. The reference code may be updated responsive to the calibration used to determine the delay to be applied to the write data strobe signal. In between these calibrations, MDLL 305 may undergo a number of self-calibrations to determine a number of delay steps required to maintain the calibrated delay of the data strobe. In one embodiments, MDLL 305 may be configured to periodically perform self-calibrations to determine the number of delay steps. For example, upon a calibration of the data strobe, a self-calibration of MDLL 305 may determine that 50 delay steps are required to set the delay of the data strobe (this value is reflected in the reference MDLL code). During a subsequent self-calibration, MDLL 305 may determine that 55 delay steps are required to maintain the calibrated delay of the data strobe (i.e. a 10% increase in a number of steps). The increased value may be reflected in the current MDLL code. Both of these pieces of information may be forwarded to code generation logic 315 in order to calculate a scaling factor based on these values. Performing the periodic self-calibrations of MDLL 305 between data strobe delay calibrations may allow for the tracking of voltage and temperature changes in the memory controller as may be necessary to maintain the data strobe delay at the calibrated value.

While MDLL 305 is discussed above as being configured to perform self-calibration, the various apparatus embodiments discussed herein are not limited to the same. Embodiments in which an MDLL 305 is calibrated using other mechanisms are possible and contemplated within the spirit and scope of this disclosure.

Additionally, as noted above, calibration circuit 170 on memory 158 may periodically perform calibrations to track the drift in the delay due to voltage and temperature changes thereon. The information from these calibrations may be provided to delay circuit 30. Using both the MDLL code and the calibration information received from calibration circuit 170, scaling factors may be applied to update the SDLL code between calibrations. When applying the scaling factors, the full number of delay elements is considered, including the number of delay elements that correspond to the half clock periods. After the scaling factors are applied, the calculations are then performed again with the scaled number of delay elements. The number of delay elements corresponding to the integer number of half clock periods within the calibrated delay value, after scaling factors have been applied, may be subtracted from the total number of delay elements after scaling to obtain the number with which SDLL 310 is to be programmed.

Figure 3:
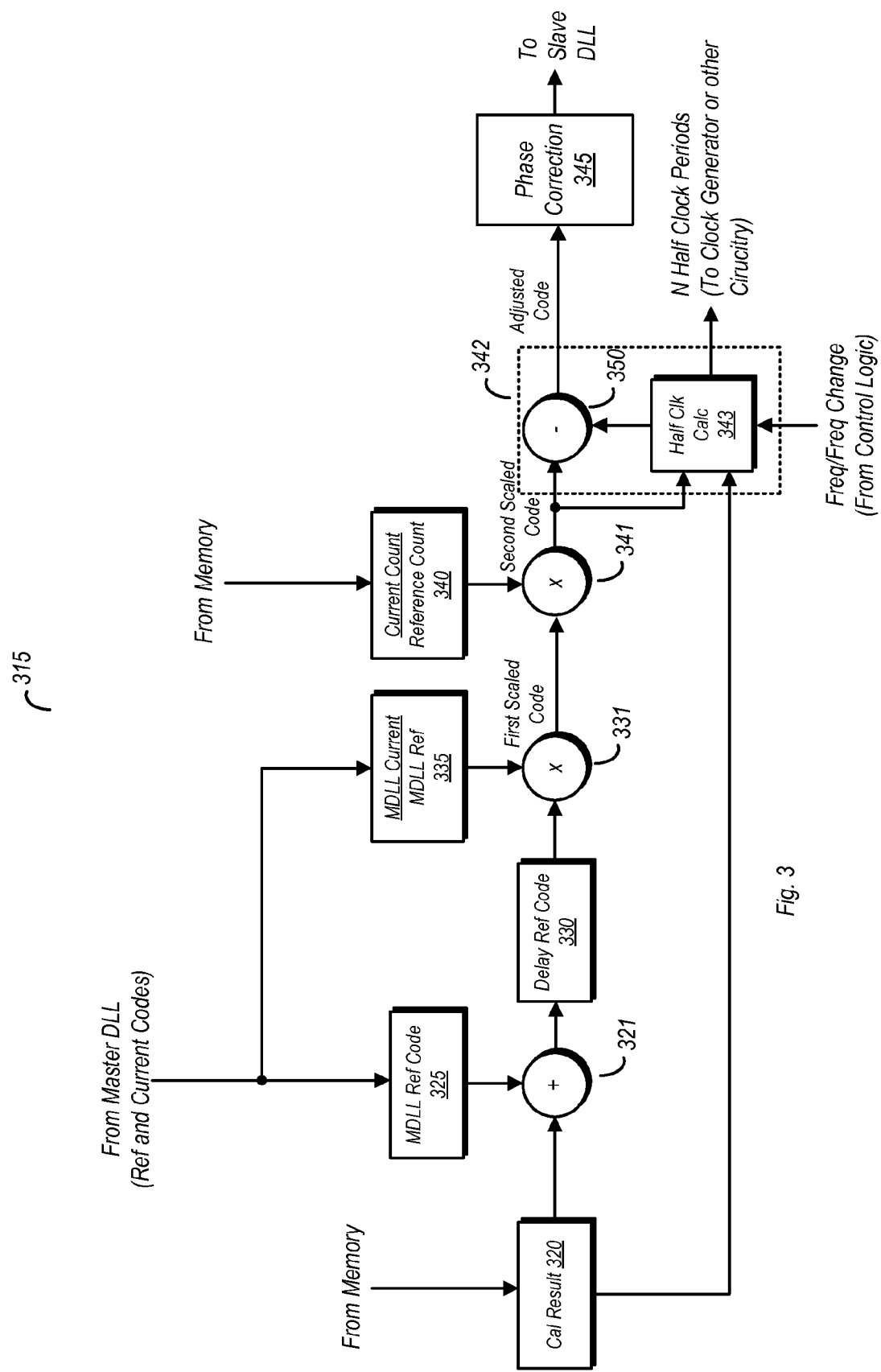
FIG. 3 is a block diagram of one embodiment of code generation circuitry.

Turning now to FIG. 3, a block diagram illustrating one embodiment of code generation logic 315 is shown. Code generation logic 315 in the embodiment shown is used to generate a code used to program SDLL 310, which is used to convey the data strobe from memory controller 12 to the memory. Two different scaling factors are generated in this embodiment, the first being based on MDLL codes, and the second being based on count values received from calibration unit 170 on memory 158. As previously noted, MDLL 305 is used in an attempt to maintain the data strobe delay at the calibrated value while adjusting for voltage and temperature changes that may occur in memory controller 12. The reference and current count values provided from calibration unit 170 on memory 158 may be used to cause adjustments to the data strobe delay responsive to changes in delay on the memory side of the interface between data strobe delay calibrations.

Upon performing a data strobe delay calibration, the determined value may be deposited in calibration result register 320. This value may be combined with the MDLL reference code by adder 321, to produce the delay reference code that is then stored in register 330. The MDLL reference code may be deposited in register 325 after MDLL 305 determines the number of delay steps just subsequent to performance of the data strobe delay calibration.

The MDLL reference code is also used in determining the first scaling factor. Subsequent to setting the MDLL reference code, additional self-calibrations of MDLL 305 occur between instances of the data strobe delay calibration. These self-calibrations of MDLL 305 are used to determine a number of delay steps to be applied in order to maintain the data strobe delay value. Each of the self-calibrations may generate a current MDLL code. Divider 305 may be used to divide the current MDLL code by MDLL reference code in order to generate a first scaling factor. The delay reference code stored in register 330 is then multiplied by the first scaling code, thereby generating a first scaled code. The first scaling factor may reflect changes in operating conditions (e.g., voltage, temperature) in memory controller 12 that could affect the delay applied to the data strobe signal.

The second scaling factor may be generated by dividing a current count value by a reference count value. Both of these values may be received from memory 158. The reference count value may be determined upon completing the data strobe delay calibration. In particular, the reference count value may correspond to the data strobe delay determined by the calibration thereof. Subsequent to determining the reference count value, additional calibrations may be performed by calibration circuit 170 to update the count value. The updated count value, referred to as the current count, is forwarded to code generation logic 315 (as is the reference count value upon its determination). The updated count value may be divided by the reference count value, in divider 340, to produce the second scaling factor. Thereafter, the second scaling factor is multiplied by the first scaled code, in multiplier 341, to produce the second scaled code.

Code generation logic 315 in the embodiment shown also includes arithmetic circuitry 342, which includes subtractor 350 and half clock calculation circuit 343. The half clock calculation circuit 343 is coupled to receive the code output from multiplier 341, the calibration result from calibration result register 320, the frequency of the clock signal, and indications of pending frequency changes from control logic 21. Using the frequency information and the calibrated delay result, half clock calculation circuit 343 may determine an integer number of half clock periods within the calibrated delay. Using the output of multiplier 341, which is the second scaled DLL code, half clock calculation circuit 343 may determine the number of delay elements that are needed to make up a half clock period of delay. If there are multiple half clock periods within the calibrated delay (e.g., 2), half clock calculation circuit 343 determine the number of delay elements needed to provide that amount of delay. Half clock calculation circuit 343 may also convert the number of delay elements into a DLL code, which is then provided to subtractor 342. Subtractor 342 may subtract this DLL code from the second scaled code to produce an adjusted code. The adjusted code is thus represents the number of delay elements after those corresponding to the integer number of half clock delay periods are removed. In the embodiment shown, phase correction circuit 345, may provide phase correction to the adjusted code, if desired, before the final code is output the SDLL. Thereafter, SDLL 310 is programmed with the final code. Half clock calculation circuit 343 also outputs the number of half clock periods, N, within the calibrated delay to the clock generation circuit 23 and/or other circuitry (e.g., control circuit 21).

It is noted that, upon performing the full calibration of the delay, the second scaled code initially output from multiplier 341 after the calibration may be equivalent to the delay reference code, as both multipliers will scale that code by a factor of one. After subsequent self-calibrations of the MDLL and the calibrations performed by calibration circuit 170 on memory 158, the scaled second code may vary from its initial, post calibration value.

It is noted in the above that the first and second scaling factors are generated based on the MDLL reference code and reference count value, respectively. This is to prevent the accumulation of errors (e.g., quantization error) that might otherwise occur if only the two most recent values for each of the reference code and reference count were used. For example, if only the two most recent values of the MDLL code were used in determining the first scaling factor, any error introduces in the most recent previous MDLL code would be factored into the calculation, along with the current code. Over several iterations, this error could accumulate. Thus, by using the reference MDLL code as the basis for calculating the first scaling factor, only error introduced during the determination of the current MDLL code is factored into the calculation, and thus only the current calculation is affected. Errors that may have been present in previous non-reference values of the MDLL code are not present or factored into any calculation of the first scaling factor using only the reference MDLL code and the current MDLL code. The same applies for calculation of the second scaling factor. Since only the reference count value and the current count value are used to calculate the second scaling factor, only error introduced in determining the current count value is present in the current calculation, but is not present in any subsequent calculation.

Figure 4:
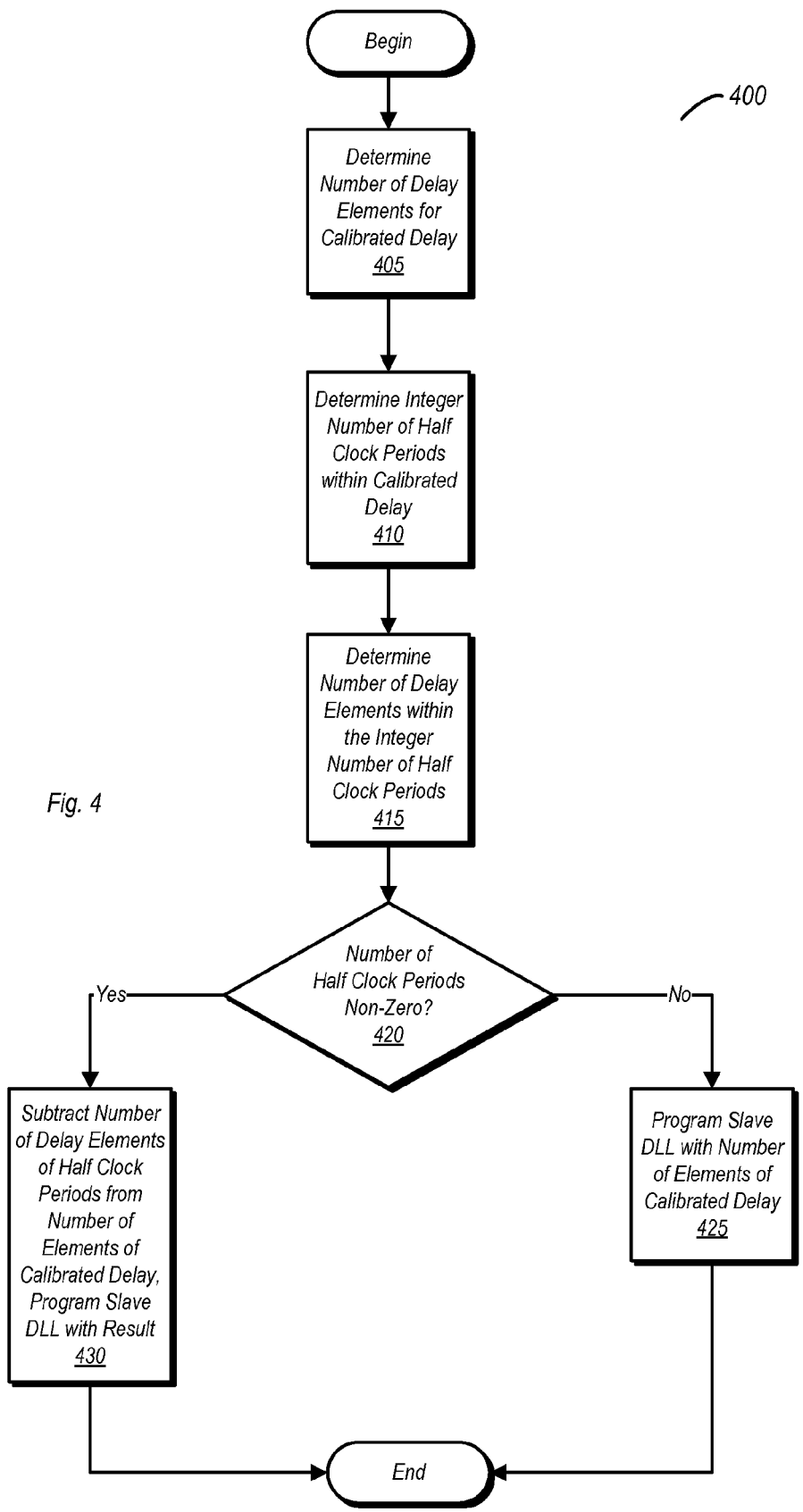
FIG. 4 is a flow diagram of one embodiment of a method for determining a number of delay elements used to generate a delay applied to a clock signal transmitted from a memory controller to a memory.

FIG. 4 is a flow diagram of one embodiment of a method for determining a number of delay elements used to generate a delay applied to a clock signal transmitted from a memory controller to a memory. Method 400 may be performed using various embodiments of the circuitry discussed above. Furthermore, embodiments of circuitry not explicitly discussed herein that are capable of performing method 400 are also possible and contemplated. Finally, it is also possible and contemplated that at least portions of method 400 may be performed using software/firmware.

Method 400 begins with determining a number of delay elements in a DLL required to provide a calibrated delay (block 405). The delay may be a compensation to a data strobe/clock signal that is required to align it with data being transferred from a memory controller to a memory. The method further includes determining an integer number of half clock periods within the calibrated delay (block 410). For example, if the delay is 550 picosecond (ps), and a half clock period is 300 ps, then there is one half clock period within the calibrated delay. If the half clock period is 250 ps (for a 550 ps delay), there are two half clock periods within the calibrated delay. After determining the integer number of half clock periods within the calibrated delay, a determination is made of the number of DLL delay elements necessary to achieve a delay equivalent to the integer number of half clock periods (block 415).

If the number of half clock periods within the calibrated delay is non-zero (block 420, yes), the number of delay elements necessary to achieve the number of half clock periods of delay is subtracted from the total number of delay elements required to provide the calibrated delay, and the slave DLL is programmed with the resulting number of delay elements (block 430). If the calibrated delay does not include any half clock periods (block 420, no), then the slave DLL is programmed with the number of delay elements determined in block 405.

Figure 5:
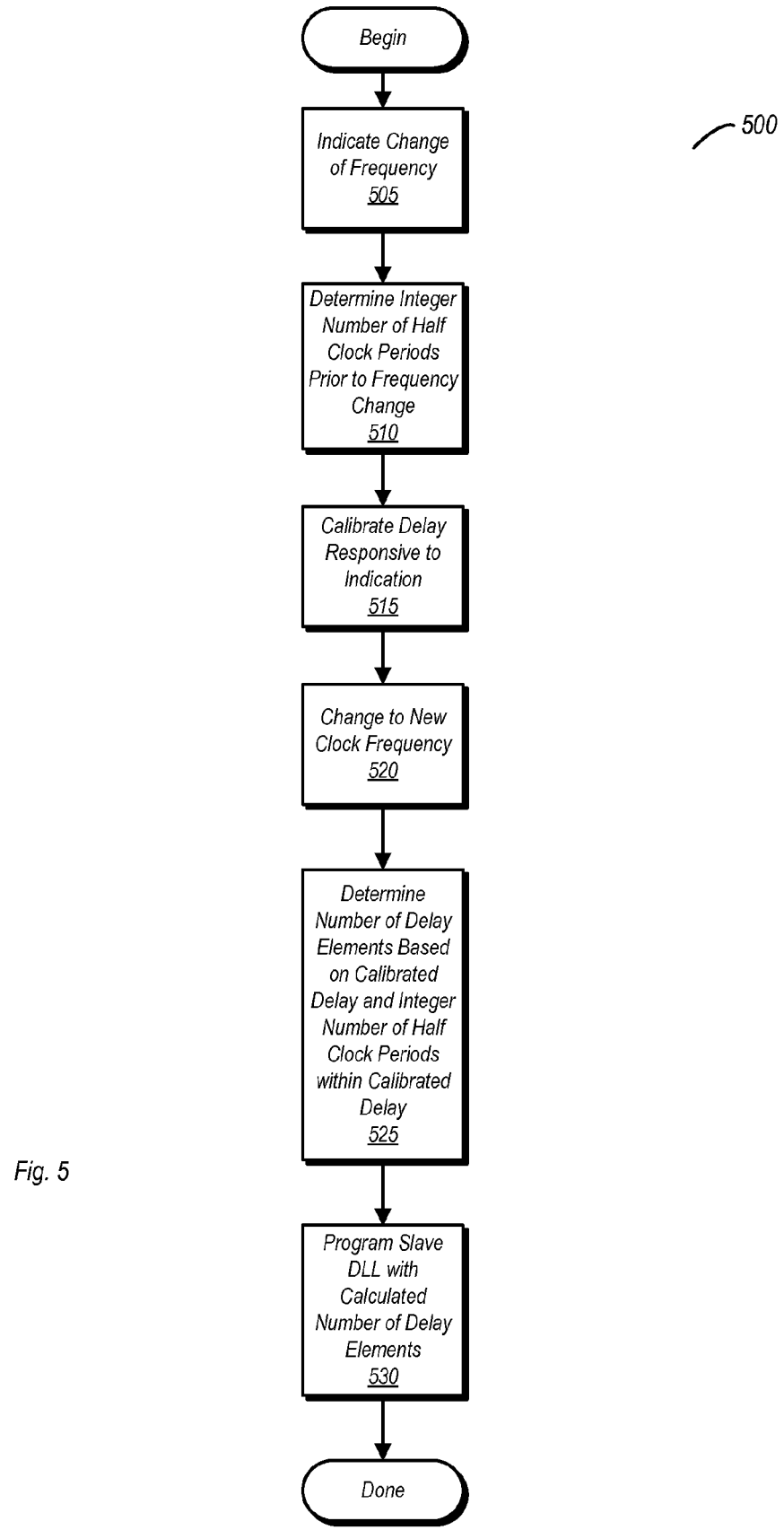
FIG. 5 is flow diagram of one embodiment of a method for adjusting a DLL code in conjunction with a change of frequency to the data strobe signal.

FIG. 5 is a flow diagram of one embodiment of a method for adjusting a DLL code in conjunction with a change of frequency to the data strobe signal. As with method 400 discussed above, method 500 may be performed with various embodiments of the circuitry discussed herein, other circuit embodiments not explicitly discussed herein, and embodiments utilizing various combinations of hardware, software, and firmware.

Method 500 begins with an indication that a change of the clock (e.g., data strobe) frequency is pending (block 505). Responsive to the indication, a calibration is scheduled to be performed to determine the clock signal delay relative to data conveyed from a memory controller to a memory. Before the calibration is performed, the number of half-clock delays at the new target frequency is predicted, e.g, by using a lookup table (block 510). For example, if the needed delay is 700 ps and a half clock delay at the new frequency is 200 ps, then N=2 (i.e. 2 half clock delays) is used while performing the calibration prior to the frequency change (i.e. at the current frequency) where the half clock delay may be, e.g., 300 ps. If N=2 at the current frequency, then we have 600 ps of delay before the frequency change and 400 ps of delay after the frequency change. With the number of half clock periods determined, the calibration is then performed and the delay is determined (block 515). Following the completion of the calibration and determination of the new delay, the clock frequency is changed to the new value (block 520). Thereafter, the number of delay elements with which the slave DLL is to be programmed is determined based on the calibrated delay and the integer number of half clock periods (block 525). Upon determining the number of delay elements, the slave DLL is then programmed (block 530).

Figure 6:
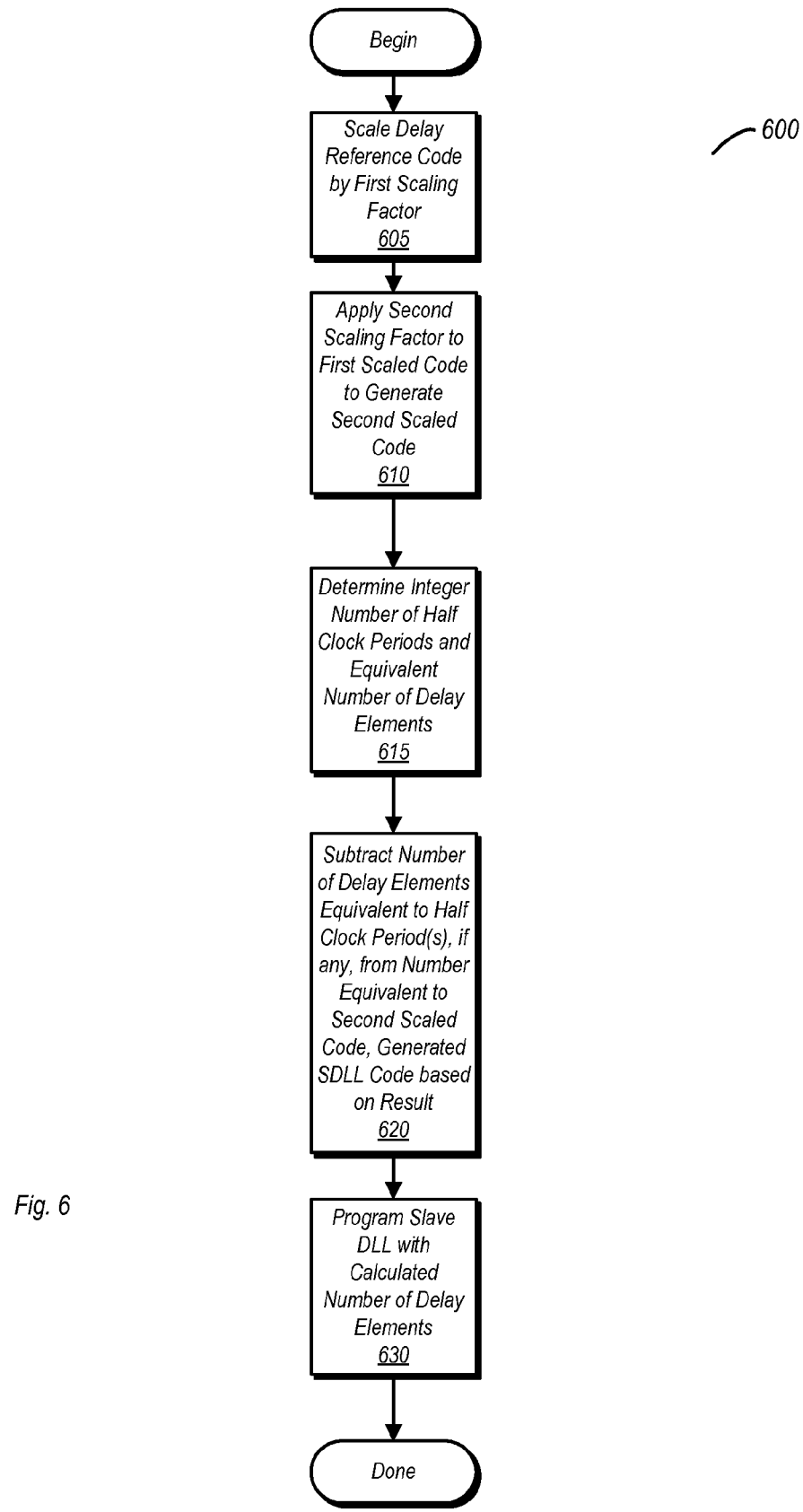
FIG. 6 is a flow diagram of one embodiment of a method for adjusting a DLL code using scaling factors.

FIG. 6 is a flow diagram of one embodiment of a method for adjusting a DLL code using scaling factors. As with methods 400 and 500 discussed above, method 600 may be performed with various embodiments of the circuitry discussed herein, other circuit embodiments not explicitly discussed herein, and embodiments utilizing various combinations of hardware, software, and firmware.

Method 600 occurs between delay calibrations. More particularly, method 600 may be performed to compensate for voltage and temperature changes that can affect the delay between calibrations thereof. Method 600 begins with the scaling of a reference delay code with a first scaling factor (block 605). The first scaling factor may be based on, e.g., a ratio of a current master DLL code (obtained from a self-calibration thereof) to a reference master DLL code. Applying the first scaling code to the reference code results in a first scaled code. Thereafter, a second scaling factor is applied to the first scaled code in order to obtain a second scaled code (block 610). The second scaling factor may be based on, e.g., a calibration done on the memory side of the interface, and may be a ratio of a current count value to a reference count value, as described above with reference to calibration circuit 170.

A number of half clock delay periods within the calibrated delay and an integer number of delay elements required to provide an equivalent amount of delay is determined (block 615). Following this, the number of delay elements required to provide a delay equivalent to the integer number of half clock periods is subtracted from the second scaled code (block 620). This may result in a final slave DLL code in some embodiments, although it is possible in other embodiments that a phase shift is performed before settling on the final slave DLL code. Thereafter, the slave DLL is programmed with the calculated number of delay elements.

Figure 7:
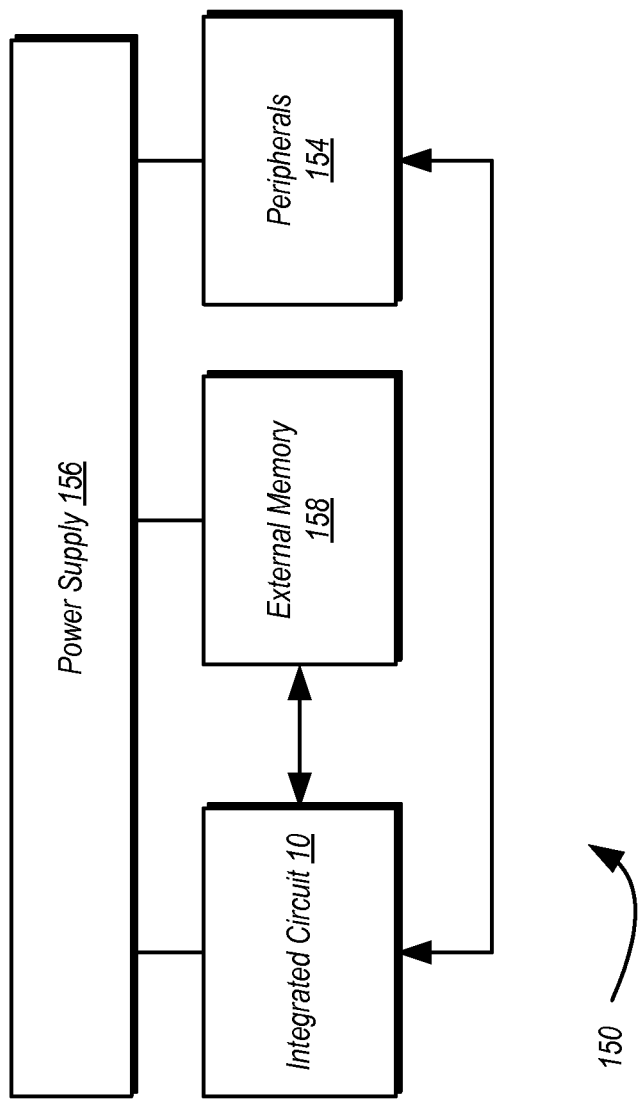
FIG. 7 is a block diagram of one embodiment of an exemplary system.

Turning next to FIG. 7, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A method comprising:
   determining a first number of delay elements in a delay locked loop (DLL) needed to provide a calibrated delay for a clock signal;
   determining an integer number of half clock periods of the clock signal, if any, within the calibrated delay;
   if the number of half clock periods is non-zero:
   determining a second number of delay elements, the second number corresponding to the integer number of half clock periods of the clock signal;
   calculating a third number of delay elements by subtracting the second number from the first number; and
   programming the DLL such that the clock signal is delayed in the DLL based on the third number of delay elements;
   if the number of half clock periods is zero, programming the DLL such that the clock signal is delayed in the DLL based on the first number of delay elements.

2. The method as recited in claim 1, further comprising an arithmetic circuit computing the number of half clock periods of the clock signal in the calibrated delay.

3. The method as recited in claim 1, further comprising:
   receiving indication of an impending change of frequency to the clock signal from a first frequency to a second frequency;

performing a calibration of the delay of the clock signal;
determining the integer number of half clock periods based on the second frequency; and
changing the frequency of the clock signal to the second frequency subsequent to determining the integer number of half clock periods.

4. The method as recited in claim 3, further comprising:
determining the first number subsequent to changing the frequency of the clock signal; and
if the integer number of half clock periods based on the second frequency is non-zero, determining the second number, calculating the third number and programming the DLL such that the clock signal is delayed in the DLL by the third number of delay elements.

5. The method as recited in claim 1, further comprising:
periodically applying scaling factors to the first number of delay elements; and
calculating the third number of delay elements subsequent to applying first and second scaling factors.

6. The method as recited in claim 5, wherein the scaling factors include the first scaling factor corresponding to a master DLL code representative of the calibrated delay, and the second scaling factor corresponding to a delay of the clock signal as received at a memory.

7. The method as recited in claim 6, wherein the first scaling factor is updated once every occurrence of a first interval, wherein the second scaling factor is updated once every occurrence of a second interval, and wherein a calibration of the delay is performed once every occurrence of a third interval, wherein the third interval is greater than either of the first and second intervals.

8. The method as recited in claim 1, wherein the first number, the second number, and the third number are represented as DLL codes.

9. An apparatus comprising:
a first register configured to store a first delay code indicating a first number of delay elements in a first delay locked loop (DLL) to provide a calibrated delay to a clock signal transmitted from a memory controller to a memory;
an arithmetic circuit configured to:
determine a number of half clock periods within the calibrated delay of the clock signal;
determine a second delay code representative of a second number of delay elements corresponding to the integer number of half clock periods of the clock signal within the calibrated delay of the clock signal; and
calculate a third number of delay elements by subtracting the second number from the first number, wherein the third number is represented by a third delay code; and
a second DLL configured to be programmed based on the third delay code, wherein the third number of delay elements is equal to the first number of delay elements if the integer number of half clock periods of the clock signal is determined by the arithmetic circuit to be zero.

10. The apparatus as recited in claim 9, further comprising a control circuit configured to control a frequency of the clock signal, wherein the control circuit is configured to provide an indication of the frequency of the clock signal to the arithmetic circuit.

11. The apparatus as recited in claim 10, wherein the control circuit is configured to, upon determining that the frequency of the clock signal is to be changed from a first frequency to a second frequency, initiate and perform a calibration of the delay of the clock signal.

12. The apparatus as recited in claim 11, wherein the arithmetic circuit is configured to, responsive to receiving an indication of the change of the frequency from the first frequency to the second frequency, determine the integer number of half clock periods within the calibrated delay subsequent to the control circuit performing the calibration and prior to the control circuit changing the frequency of the clock signal from the first frequency to the second frequency.

13. The apparatus as recited in claim 12, wherein the first DLL is a self-calibrating DLL, and wherein the first DLL is configured to determine the first number of delay elements subsequent to the control circuit changing the frequency of the clock signal from the first frequency to the second frequency.

14. The apparatus as recited in claim 13, wherein the arithmetic circuit is configured to, responsive to determining that the number of half clock periods within the calibrated delay is non-zero at the second frequency, determine the second number of delay elements and calculate the third number of delay elements.

15. The apparatus as recited in claim 9, further comprising scaling circuitry configured to apply first and second scaling factors to the first number of delay elements, wherein the arithmetic circuit is configured to calculate the third number of delay elements subsequent to the scaling circuitry applying the first and second scaling factors.

16. The apparatus as recited in claim 15, wherein the first scaling factor corresponds to a reference code for the first DLL, and wherein the second scaling factor corresponds to a delay of the clock signal as received at the memory.

17. The apparatus as recited in claim 15, wherein the first DLL is a self-calibrating DLL configured to update a reference code once every occurrence of a first interval, wherein the memory is configured to provide the second scaling factor once every occurrence of a second interval, and wherein a control circuit is configured to perform calibration of the delay once every occurrence of a third interval that is greater than either of the first and second intervals.

18. A system comprising:
a memory having a plurality of storage locations;
a memory controller coupled to write data to the memory, wherein the memory controller is configured to convey a plurality of data signals and a clock signal to the memory, wherein the memory controller includes master and slave delay locked loops (DLLs) configured to control a delay of the clock signal, and wherein the memory controller further includes:
a first register configured to store a first delay code indicating a first number of delay elements in a first delay locked loop (DLL) to provide a calibrated delay to the clock signal;
an arithmetic circuit configured to:
determine a number of half clock periods within the calibrated delay of the clock signal;
determine a second delay code representative of a second number of delay elements corresponding to the integer number of half clock periods of the clock signal within the calibrated delay of the clock signal; and
calculate a third number of delay elements by subtracting the second number from the first number, wherein the third number is represented by a third delay code; and
a second DLL configured to be programmed based on the third delay code, wherein the third number of delay elements is equal to the first number of delay elements if the integer number of half clock periods of the clock signal is determined by the arithmetic circuit to be zero.

19. The system as recited in claim 18, further comprising:
a control circuit configured to control a frequency of the clock signal, wherein the control circuit is configured to provide an indication of the frequency of the clock signal to the arithmetic circuit, wherein the control circuit is configured to, upon determining that the frequency of the clock signal is to be changed from a first frequency to a second frequency, initiate and perform a calibration of the delay of the clock signal;
wherein the arithmetic circuit is configured to, responsive to receiving an indication of the change of the frequency from the first frequency to the second frequency, determine the integer number of half clock periods within the calibrated delay subsequent to the control circuit performing the calibration and prior to the control circuit changing the frequency of the clock signal from the first frequency to the second frequency.

20. The system as recited in claim 19, further comprising scaling circuitry configured to apply first and second scaling factors to the first number of delay elements, wherein the arithmetic circuit is configured to calculate the third number of delay elements subsequent to the scaling circuitry applying the first and second scaling factors.

\* \* \* \* \*